United States Patent [19]
Ogihara et al.

[11] Patent Number: 5,821,567
[45] Date of Patent: Oct. 13, 1998

[54] HIGH-RESOLUTION LIGHT-SENSING AND LIGHT-EMITTING DIODE ARRAY

[75] Inventors: Mitsuhiko Ogihara; Yukio Nakamura; Takatoku Shimizu; Masumi Taninaka, all of Tokyo, Japan

[73] Assignee: Oki Electric Industry Co., Ltd., Tokyo, Japan

[21] Appl. No.: 763,860

[22] Filed: Dec. 11, 1996

[30] Foreign Application Priority Data

Dec. 13, 1995 [JP] Japan ..................................... 7-324159
Apr. 9, 1996 [JP] Japan ..................................... 8-086939

[51] Int. Cl.$^6$ ..................................................... H01L 33/00
[52] U.S. Cl. .............................. 257/88; 257/91; 257/101; 257/443; 257/463; 257/464
[58] Field of Search ................................ 257/88, 91, 99, 257/102, 101, 443, 461, 463, 464

[56] References Cited

FOREIGN PATENT DOCUMENTS

| | | |
|---|---|---|
| 56-30776 A | 3/1981 | Japan . |
| 58-66370 A | 4/1983 | Japan . |
| 59-146875A | 8/1984 | Japan . |
| 07066454 A | 3/1995 | Japan . |

*Primary Examiner*—Minh-Loan Tran
*Attorney, Agent, or Firm*—Spencer & Frank

[57] ABSTRACT

A light-sensing/emitting diode array chip has impurity diffusion regions with a depth of at least 0.5 μm but not more than 2 μm in a semiconductor substrate. Each impurity diffusion region is preferably divided into a first region, used for emitting or sensing light, and a wider second region, used for electrode contact. The second regions are located on alternate sides of the array line, permitting a small array pitch to be combined with a large contact area. In a wafer process for fabrication of the chips, a diffusion mask has both windows defining the impurity diffusion regions, and dicing line marks. The dicing line marks are narrowed where they pass adjacent to the windows at the ends of the chip. In the electrode fabrication step, a photomask with an enlarged pattern is used, to allow for misalignment with the diffusion mask.

29 Claims, 16 Drawing Sheets

HIGH-RESOLUTION LIGHT-SENSING AND LIGHT-EMITTING DIODE ARRAY

BACKGROUND OF THE INVENTION

The present invention relates to a high-resolution array of light-sensing or light-emitting diodes, or a high-resolution array of diodes used for both sensing and emitting light, and to fabrication methods thereof.

Light-emitting and/or light-sensing diode arrays are used for scanning and printing documents in devices such as electrophotographic printers and copiers, and in scanners. These arrays generally comprise a plurality of chips, each containing part of the array. The diodes are formed by diffusion of an impurity into the chip substrate, through windows in a diffusion mask, e.g. by diffusion of zinc (Zn) into a layer of gallium-arsenide-phosphide (GaAsP). Conventional arrays have had resolutions in the range from three hundred to six hundred diodes per inch, often referred to as dots per inch (DPI).

High-quality printing requires light-emitting-diode (LED) arrays with still higher resolutions, however. At least one thousand two hundred dots per inch (1200 DPI) is desirable, but certain problems are encountered in the fabrication of LED arrays with resolutions this high.

There is, for example, the problem of unwanted lateral diffusion. Experience has shown that lateral diffusion up to 1.5 times the diffusion depth must be allowed for. With the conventional diffusion depth of five micrometers (5 $\mu$m), zinc can be expected to diffuse up to 7.5 $\mu$m sideways from the edges of the diffusion windows. Experiments performed by the inventors indicate that well-shaped diffusion windows need to be at least 5 $\mu$m wide, and an undiffused area at least about 5 $\mu$m wide is desirable for reliable separation of adjacent diodes. Thus with conventional methods, the minimum diode spacing pitch is 25 $\mu$m (5+5+7.5+7.5), but the pitch required for 1200 DPI is 21.2 $\mu$m. If the diffusion depth is reduced to enable the spacing to be reduced, with conventional fabrication methods, there is a sharp reduction in emitted light intensity.

Another problem is that of providing adequate electrical contact between the diffused diodes and the electrodes that selectively feed current to the diodes. As the contact area decreases, the contact resistance increases; beyond a certain resistance value, the circuit driving the array (typically an integrated circuit on a separate semiconductor chip, operating with a fixed supply voltage) becomes unable to supply the current necessary for correct emission of light. Keeping the contact resistance within the necessary limit becomes a difficult problem at 1200 DPI, due both to the small size of the diode diffusions and the difficulty of accurate mask alignment.

Yet another problem arises when the LED array chips are fabricated on a wafer that is diced along lines formed by removing part of the diffusion mask. When the impurity is diffused through the diffusion windows, it also diffuses through the dicing line marks, creating unwanted diffusion regions in the vicinity of the dicing lines. At the ends of each chip, these unwanted diffusion regions are located in close proximity to diffusion regions forming diodes in the array, and become a source of light leakage at these diodes. In the worst case, the unwanted diffusions merge with the diode diffusions, causing the chip to be rejected as defective. This problem becomes particularly serious in high-resolution arrays.

Conventional methods thus require considerable improvement if a satisfactory 1200-DPI LED array is to be produced. The same is true of 1200-DPI arrays of light-sensing diodes, or of 1200-DPI arrays of diodes used for both emitting and sensing light. The term light-sensing/emitting diode array will be used generically below to denote an array of diodes that sense, emit, or both sense and emit light.

SUMMARY OF THE INVENTION

A specific object of the present invention is to provide a light-emitting-diode array having a resolution of at least 1200 DPI, with a light-emitting intensity adequate for use in electrophotographic printing.

A more general object of the invention is to provide a high-resolution light-sensing/emitting diode array for use in any type of device in which such an array is required.

Another object of the invention is to assure adequate electrical contact between the electrodes and impurity diffusion regions of a high-resolution light-sensing/emitting diode array.

Yet another object is to enable dicing line marks on a wafer of high-resolution light-sensing/emitting diode array chips to be formed by patterning of the same diffusion mask as used for diffusion of the diodes, without leaving unwanted impurity diffusion regions at the ends of the arrays.

The invented light-sensing/emitting diode array chip is formed by selectively doping a semiconductor substrate of one conductive type with an impurity of another conductive type, thus forming impurity diffusion regions. The doping is carried out so that the impurity diffusion regions have a depth of at least 0.5 $\mu$m but not more than 2 $\mu$m in the semiconductor substrate, thus avoiding large lateral diffusion. The surface concentration of the impurity is preferably at least $5 \times 10^{19}$ carriers per cubic centimeter; in a light-emitting diode array, this concentration provides adequate light-emitting intensity.

The chip also has electrodes that supply current to the impurity diffusion regions individually. Each impurity diffusion region preferably comprises a first region that emits or senses light but does not make contact with the electrode, and a second region that does make contact with the electrode. The first and second regions are contiguous. The impurity diffusion regions are disposed along an array line, with odd-numbered impurity diffusion regions and even-numbered impurity diffusion regions having their second regions on opposite sides of the array line. This arrangement enables the second regions to be widened to provide a large contact area and thus low contact resistance, without enlargement of the first regions.

The invented light-sensing/emitting diode array chips can be placed end-to-end to form a light-sensing/emitting diode array. In the impurity diffusion regions at the ends of each chip, the first and second regions preferably have a special configuration in which the second regions approach no closer than the first regions to the ends of the chip.

The invented light-sensing/emitting diode array chip can be fabricated by solid-phase diffusion or ion implantation. In either case, the diffusion mask may have both windows defining the impurity diffusion regions, and dicing line marks. Where the dicing line marks pass adjacent to the windows at the ends of the chip, the dicing line marks are narrowed so as to keep a certain distance from the adjacent windows, thereby avoiding problems associated with lateral diffusion of the impurity from the dicing line marks.

The electrodes are fabricated by using a photomask to define the electrode patterns. The patterns in the photomask are preferably enlarged to allow for anticipated misalignment between the photomask and diffusion mask, so that an adequate contact area between the electrodes and impurity diffusion regions can be assured despite the misalignment.

BRIEF DESCRIPTION OF THE DRAWINGS

Embodiments of the invention will be described with reference to the attached illustrative drawings, in which.

DETAILED DESCRIPTION OF THE INVENTION

The embodiments described below are LED array chips suitable for use in an electrophotographic printer, but it will be clear that the same inventive concepts can be applied to other types of light-sensing/emitting diode arrays as well.

First Embodiment

Figure 1:
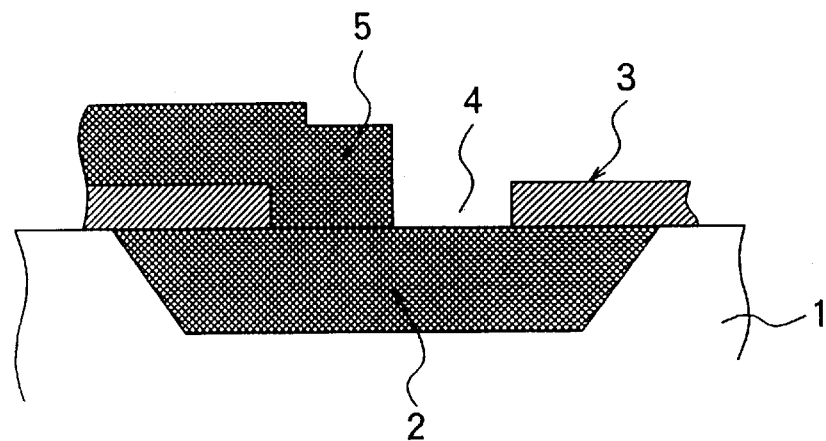
FIG. 1 is a sectional drawing of one light-emitting diode in a LED array chip.

The first embodiment is a 1200-DPI LED array chip. FIG. 1 shows a cross-section through one diode in the array. The array is formed by selectively diffusing or otherwise introducing zinc, which is a p-type impurity, into an n-type substrate 1 comprising an n-type $GaAs_{1-x}P_x$ epitaxial layer grown on an n-type GaAs base substrate. The diffusion is made into the epitaxial layer. The base substrate and epitaxial layer will be shown as a single substrate 1 in the drawings.

The diffusion is performed through a diffusion mask 3, with one diffusion window 4 defining each diode. Each diode has an anode electrode 5 (referred to below as a p-electrode), which makes contact with the impurity diffusion region 2. The diffusion mask 3 is left in place to provide electrical isolation between the p-electrode 5 and substrate 1. Light, generated when forward current flows through the pn junction between the p-type impurity diffusion region 2 and n-type substrate 1, is emitted through the exposed part of the impurity diffusion region 2 not covered by the p-electrode 5.

Figure 2:
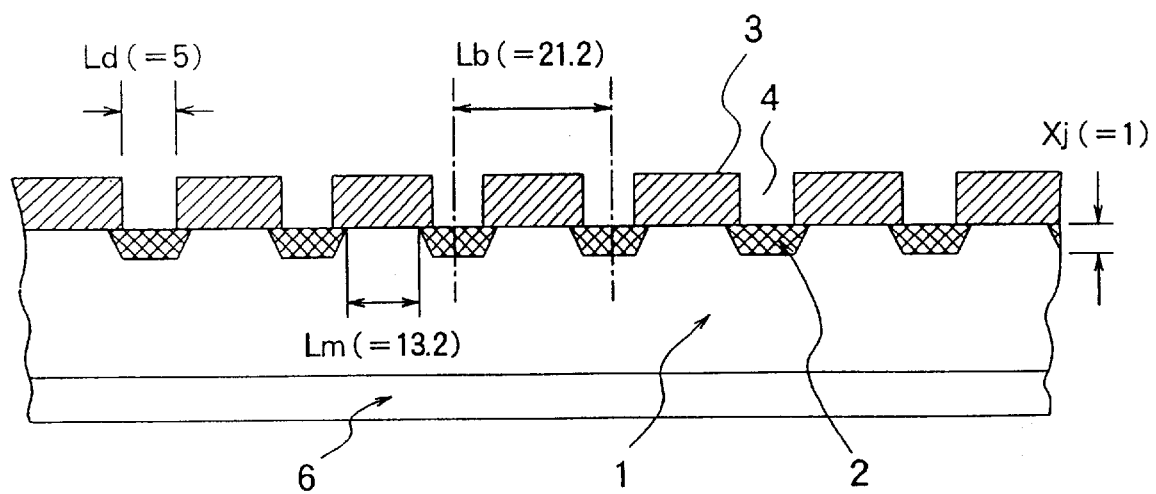
FIG. 2 is a sectional drawing of a LED array chip with dimensions according to a first embodiment of the invention.

FIG. 2 shows a sectional view through the diodes in a plane parallel to the array direction, at right angles to the sectional view in FIG. 1. The same reference numerals are used as in FIG. 1. The p-electrodes are not shown, but FIG. 2 shows a common cathode electrode 6 (referred to below as an n-electrode) that covers the underside of the substrate 1. Each impurity diffusion region 2 creates one light-emitting diode. Light is generated by current flowing from the p-electrode 5 shown in FIG. 1 to the n-electrode 6 shown in FIG. 2.

The symbol Lb denotes the diode spacing or pitch, which is substantially 21.2 $\mu$m; Ld denotes the width of the diffusion windows in the array direction, which is 5 $\mu$m; Xj denotes the diffusion depth, which is 1 $\mu$m; and Lm denotes the width of the undiffused area between adjacent impurity diffusion regions 2, referred to below as the diffusion margin. The size of the diffusion margin is 13.2 $\mu$m, as can be verified from the following equation.

$$Lm = Lb - Ld - 2 \times (1.5 \times Xj) = 21.2 - 5 - 2 \times (1.5 \times 1) = 13.2$$

Figure 3:
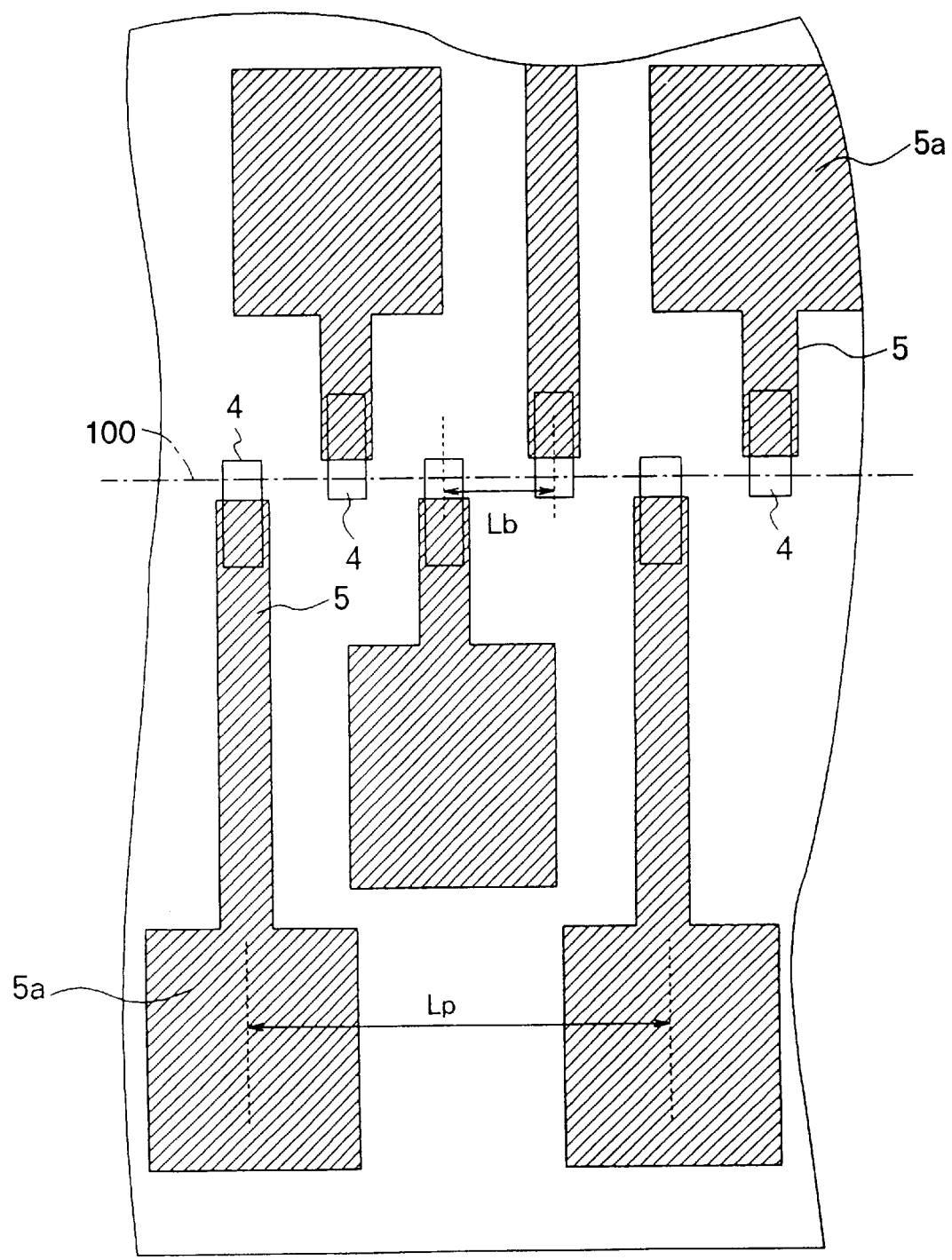
FIG. 3 is a top view of the LED array chip in FIG. 2.

FIG. 3 shows a top view of the LED array chip. The diffusion windows 4 are rectangular in shape, with a width of 5 $\mu$m in the array direction along line dot-dash chain line 100, as noted above, and a length of 15 $\mu$m in the direction perpendicular to line 100. A space of substantially 16.2 $\mu$m exists between adjacent diffusion windows 4. The diffusion windows 4 are disposed in a staggered arrangement, with their long ends extending alternately above and below the array line 100. The p-electrodes 5 are disposed alternately above and below line 100, so that odd-numbered diodes in the array have their p-electrodes on one side of line 100, and the even-numbered diodes have their p-electrodes on the other side of line 100. The exposed parts of the diffusion windows 4, not covered by the p-electrodes 5, are substantially square in shape and are aligned on the array line 100.

Where the p-electrodes 5 cover the diffusion windows 4, the width of the p-electrodes 5 is slightly greater than the width of the diffusion windows 4. At their far ends, the p-electrodes 5 widen to form bonding pads 5a, for attachment of bonding wires (not shown) that connect the LED array chip to an external device such as a driver integrated circuit (IC). The bonding pads 5a on each side of line 100 are disposed in a staggered pattern, permitting large bonding pads to be formed while maintaining an adequate separation between adjacent pads. In any line parallel to the array line 100, the bonding-pad pitch Lp is substantially 84.8 μm, four times the diode pitch Lb.

One feature of the first embodiment is that the diffusion margin of 13.2 μm is more than adequate to assure electrical isolation between adjacent diodes, with a generous tolerance for fabrication process variations. Another feature is that the diodes are formed by a process (described later) that permits the diffusion depth to be controlled to within an accuracy of about ±10%. Adjacent diodes thus remain well isolated even if lateral diffusion somewhat exceeds the normal limit of 1.5×Xj. Yet another feature is that the diffusion concentration of zinc at the substrate surface is at least about $5 \times 10^{19}$ carriers per cubic centimeter ($5 \times 10^{19}$ cm$^{-3}$); this provides adequate optical output, as will be described next.

Figure 4A:
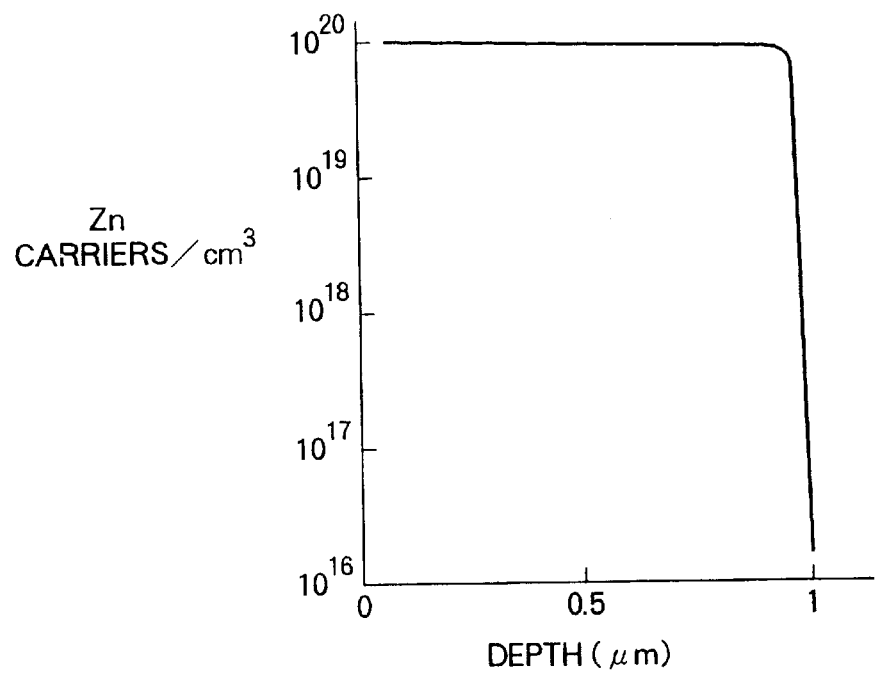
FIG. 4A is a drawing showing the zinc concentration profile in the first embodiment.

FIG. 4A shows the concentration profile of zinc in the first embodiment. Depth in the substrate 1 is shown on the horizontal axis, and concentration in carriers per cubic centimeter is shown logarithmically on the vertical axis. The concentration from the surface down to the diffusion depth of 1 μm remains substantially constant at $1 \times 10^{20}$ cm$^{-3}$, then falls quickly by several orders of magnitude, forming a good pn junction. This profile can be obtained with a solid-phase diffusion process, described later. Similar profiles have been confirmed for solid-phase diffusion with depths in the range from 0.5 μm to 2 μm.

Figure 4B:
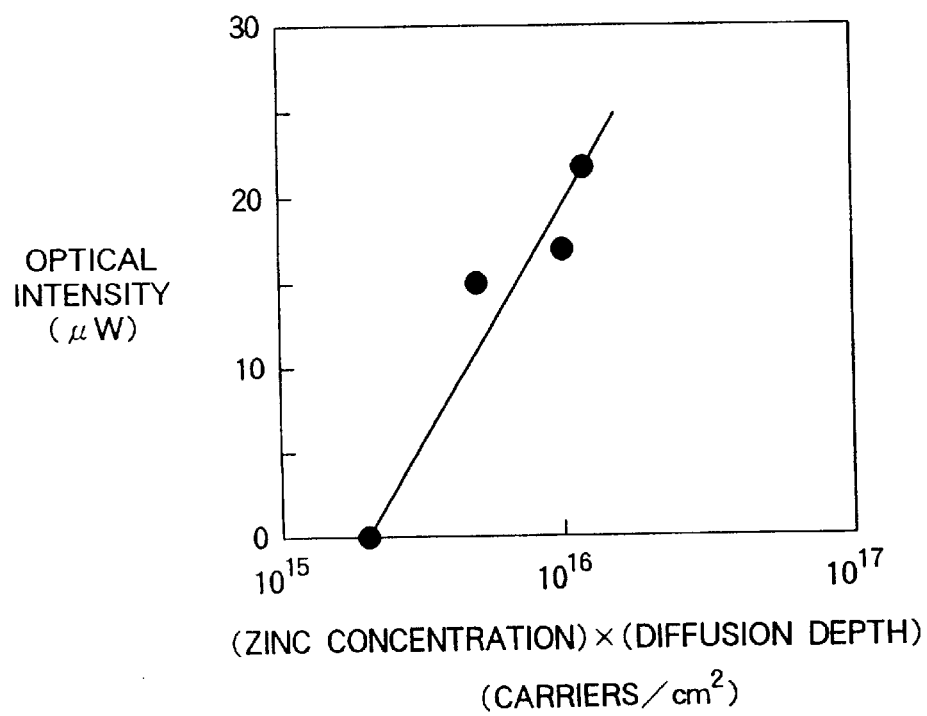
FIG. 4B shows a relationship among zinc concentration, diffusion depth, and emitted light intensity.

FIG. 4B illustrates the dependence of the emitted light intensity on the impurity concentration and diffusion depth in the impurity diffusion regions. Emitted light intensity is shown in microwatts (μW) on the vertical axis. The product of the zinc impurity concentration and the diffusion depth is shown on a logarithmic scale on the horizontal axis. Zinc concentration is measured in carriers per cubic centimeters (cm$^{-3}$) and diffusion depth is measured in centimeters (cm), so their product (zinc concentration x diffusion depth) is measured in carriers per square centimeter (cm$^{-2}$). The data points shown in FIG. 4B are for currents of five milliamperes (5 mA) fed to light-emitting diodes with equal light-emitting areas.

As the drawing indicates, when the product of zinc concentration and diffusion depth is $2 \times 10^{15}$ cm$^{-2}$, the emitted light intensity is substantially zero. When the product is about $5 \times 10^{15}$ cm$^{-2}$, the emitted light intensity is substantially 15 μW. When the product is about $1 \times 10^{16}$ cm$^{-2}$, the emitted light intensity is substantially 20 μW. An emitted light intensity of about 15 μW in the light-emitting diodes employed in this measurement corresponds to an intensity sufficient for use as a light source in an electrophotographic printer.

Light-emitting elements in which the product of zinc concentration and diffusion depth is at least about $5 \times 10^{15}$ cm$^{-2}$ thus provide sufficient light intensity for light-source use in a printer. In the 1200-DPI LED array chip of the first embodiment, in which the diffusion depth is substantially 1 μm ($1 \times 10^{-4}$ cm), a zinc concentration of about $5 \times 10^{19}$ cm$^{-3}$ or more is accordingly adequate.

Experiments performed by the inventors also indicate that the maximum zinc impurity concentration in a light-emitting diode fabricated by solid-phase diffusion is about $1 \times 10^{20}$ cm$^{-3}$, as shown in FIG. 4A. Since the product of zinc concentration and diffusion depth must be at least about $5 \times 10^{15}$ cm$^{-2}$, the minimum diffusion depth is substantially 0.5 μm.

Figure 5:
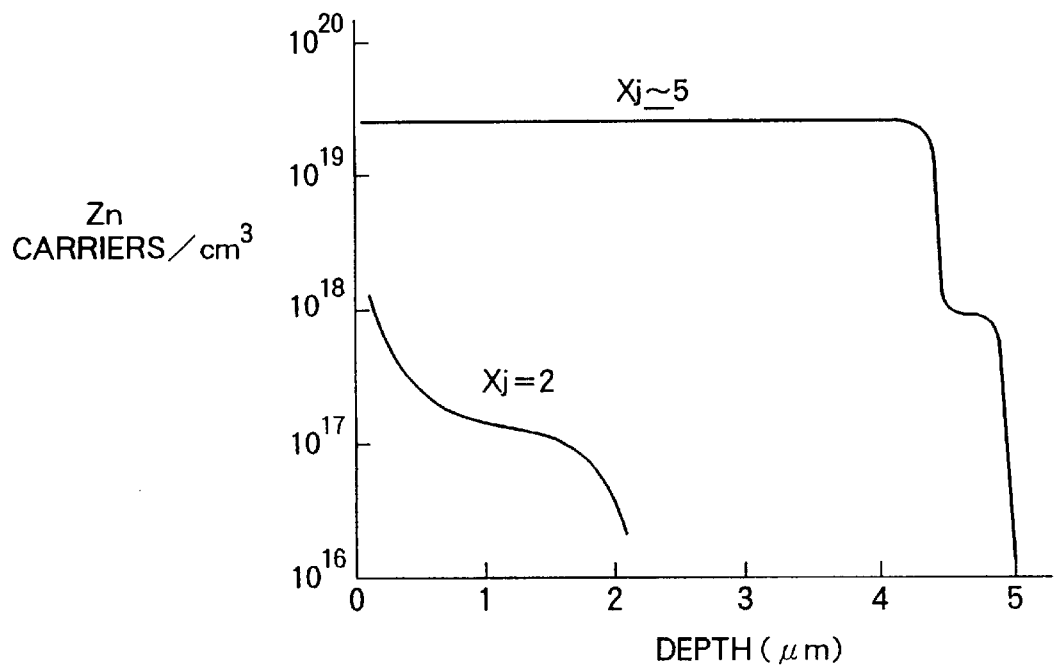
FIG. 5 shows zinc concentration profiles for conventional LED array chips fabricated by vapor-phase diffusion.

For comparison, FIG. 5 shows diffusion profiles for a conventional vapor-phase diffusion process with diffusion depths Xj of 2 μm and 5 μm. The vertical and horizontal axes have the same meaning as in FIG. 4A. For a diffusion depth of 5 μm, a satisfactory profile is obtained, but for 2 μm, the profile is highly unsatisfactory, the concentration being only about $10^{18}$ carriers per cubic centimeter at the surface, and decreasing to about $10^{17}$ carriers per cubic centimeter at a depth of 1 μm. This low concentration makes the sheet resistance of the diffusion regions extremely high, so that a large voltage drop occurs in areas removed from the p-electrodes, with a consequent reduction in light emission. Because of the voltage drop, much of the emission occurs directly below the p-electrode, where the light is blocked by the electrode.

Figure 6:
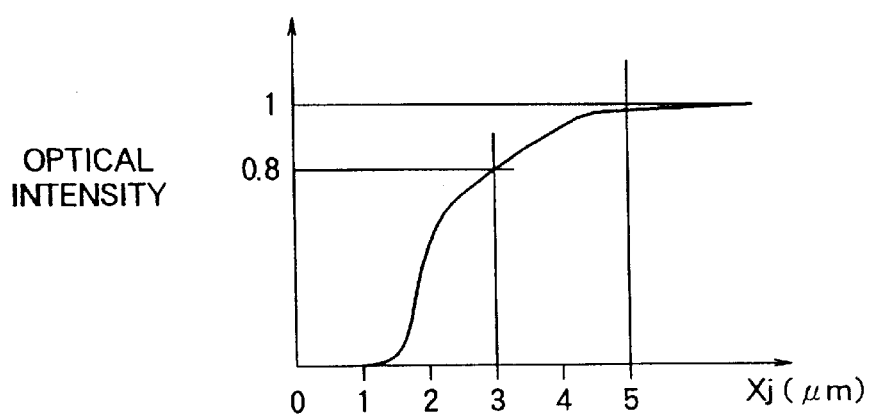
FIG. 6 shows the relationship between diffusion depth and emitted light intensity in a conventional LED array chip.

FIG. 6 illustrates the relationship between the diffusion depth Xj in a LED array created by conventional vapor-phase diffusion and the emitted luminous intensity. The horizontal axis indicates the diffusion depth (the depth of the pn junction). The vertical axis indicates the emitted intensity in relative units. Substantially no light is emitted when the diffusion depth is 1 μm. The emitted intensity increases gradually as the diffusion depth increases from 1 μm to 5 μm, and saturates when the depth reaches about 5 μm. For this reason, LED arrays formed by vapor-phase diffusion have generally had a diffusion depth in the range from 5 μm to 6 μm.

Figure 7:
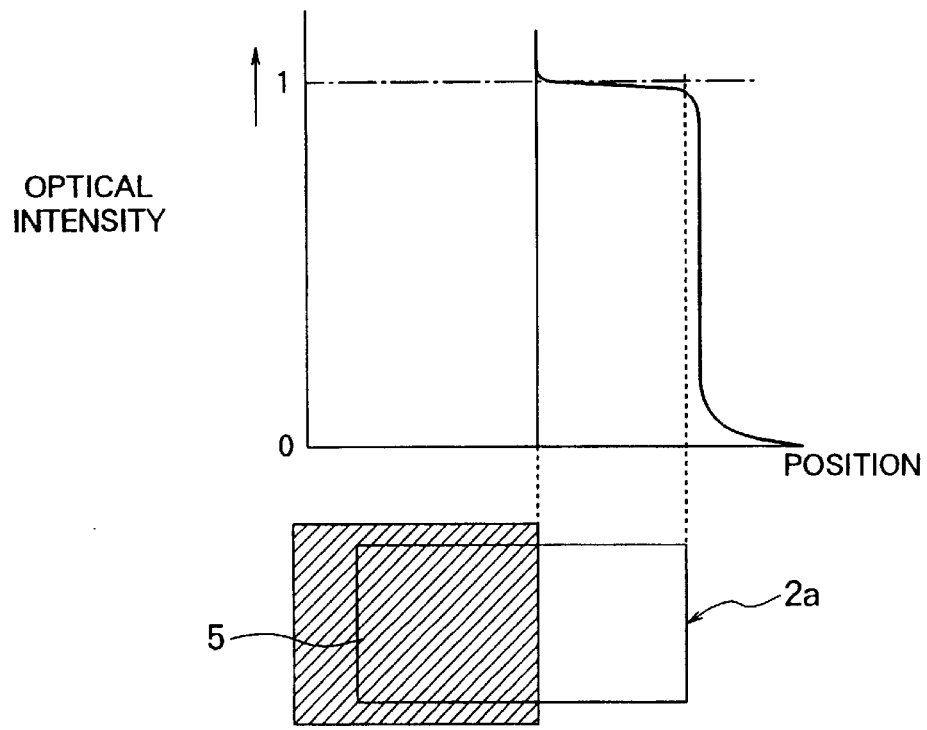
FIG. 7 illustrates the spatial intensity distribution of a light-emitting diode in the first embodiment.

For the first embodiment, FIG. 7 illustrates the relationship between emitted luminous intensity, shown on the vertical axis, and position within the emitting area of the diodes, as shown on and below the horizontal axis. Because of the high carrier concentration and low sheet resistance of the diffusion region, light is emitted with a substantially even intensity at all points in the square light-emitting area 2a that is not covered by the p-electrode 5. A total emitted intensity adequate for use in an electrophotographic printing is thus easily obtained.

Figure 8:
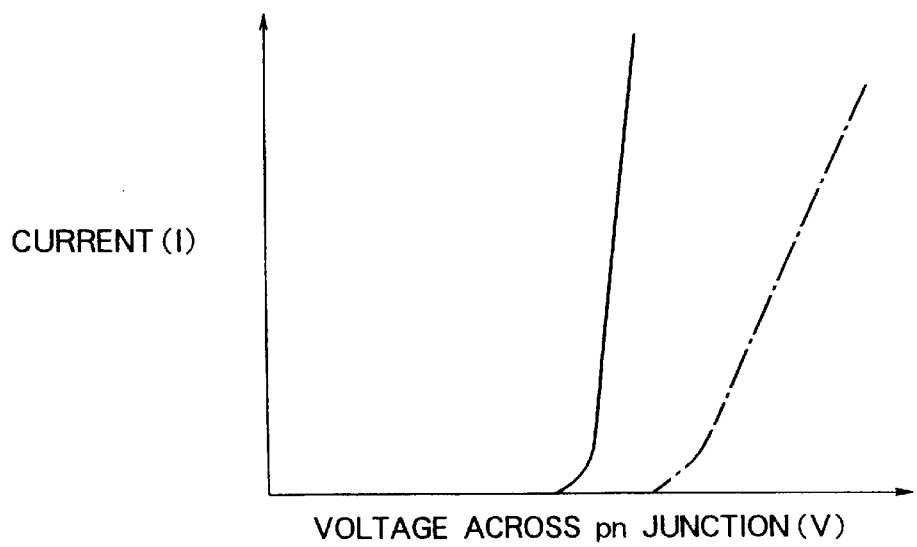
FIG. 8 shows the current-voltage characteristics of semiconductor wafers with high and low sheet resistance.

FIG. 8 illustrates the current-voltage characteristic of a pn junction formed in a semiconductor wafer with a low sheet resistance (solid line), and of a pn junction formed in a semiconductor wafer with a high sheet resistance (dot-dash line). The horizontal axis represents the voltage applied across the pn junction; the vertical axis represents the current flow. With a high sheet resistance, considerable additional voltage is required to increase the current flow. With a low sheet resistance, the voltage dependence is much less; a high current flow does not require a high voltage. The low sheet resistance in the first embodiment thus enables the LED array to be driven by a driver IC operating at a normal supply-voltage level; the voltage does not have to be raised to compensate for the small size and shallow depth of the diodes.

Figure 9:
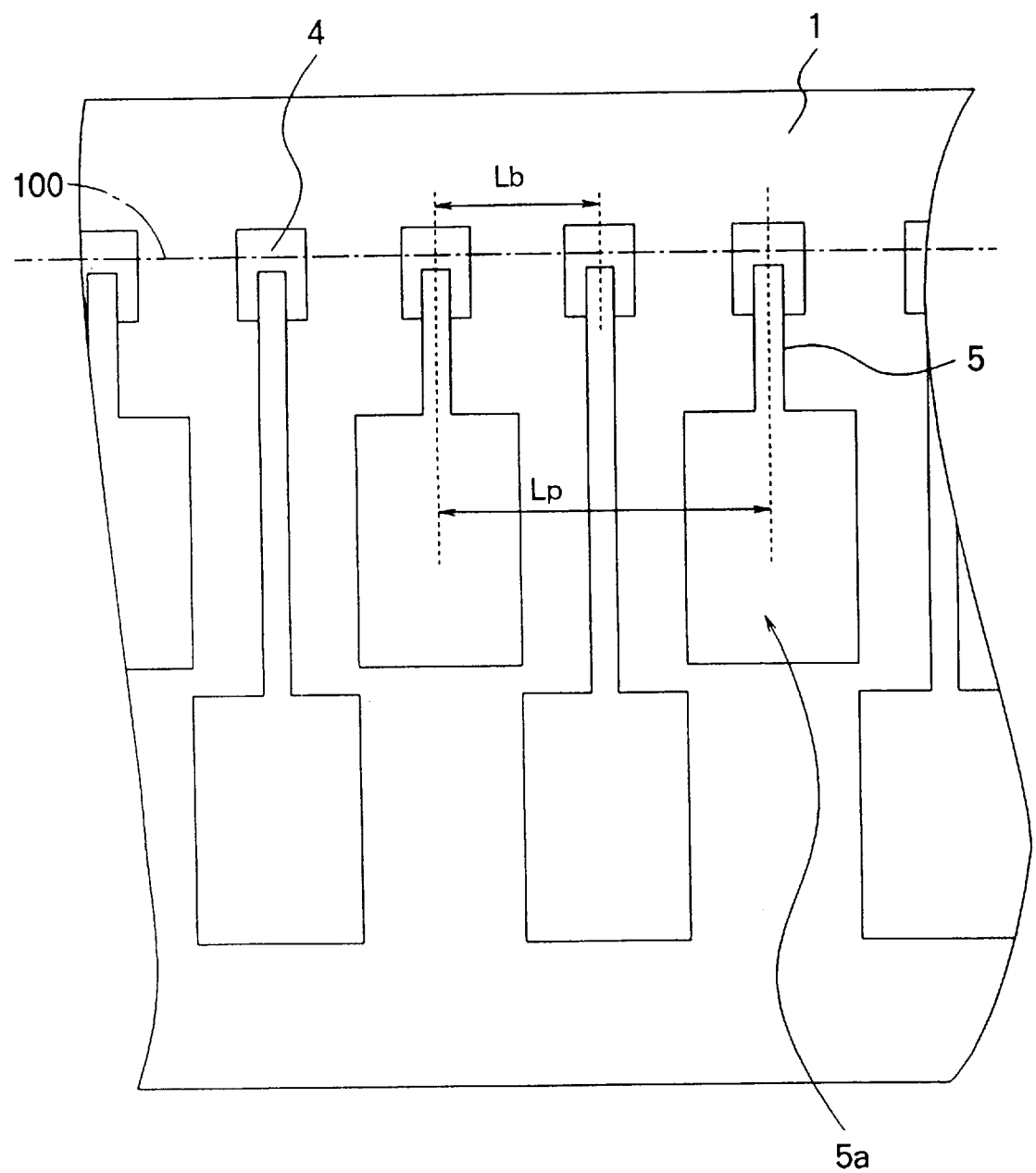
FIG. 9 illustrates a conventional electrode arrangement.

One more feature of the first embodiment is that the p-electrode geometry permits adequate electrical contact with the impurity diffusion regions and adequate space for the attachment of bonding wires to be assured despite the high 1200-DPI resolution. For comparison, FIG. 9 shows a conventional array having p-electrodes 5 on only one side of the array line, and only partly covering one end of the diffusion windows 4. In a line through the bonding pads 5a and parallel to the array line 100, the bonding-pad pitch Lp is only twice the diode pitch Lb, instead of four times the diode pitch as in the first embodiment. For a given bonding-pad width, the first embodiment permits about twice the resolution to be attained, and can provide a greater area of contact between the p-electrodes 5 and impurity diffusion regions 2, as can be seen by comparing FIG. 9 with FIG. 3.

Next, a fabrication method for the first embodiment will be described with reference to FIGS. 10 to 14.

Figure 10:
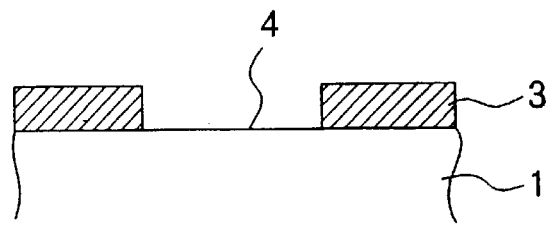
FIG. 10 illustrates a first step in a solid-phase diffusion process for fabricating the first embodiment.

In FIG. 10, an aluminum nitride (AlN) film has been deposited as a diffusion mask 3 on the n-type substrate 1, and diffusion windows 4 have been created by standard photolithographic techniques, using hot phosphoric acid as an etchant.

Figure 11:
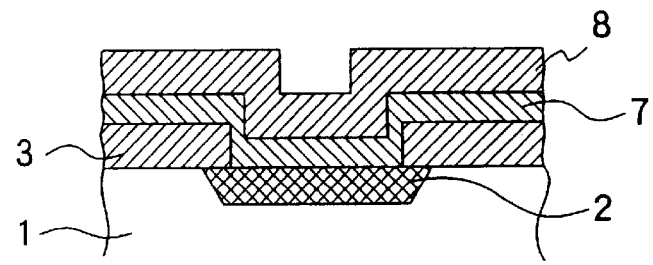
FIG. 11 illustrates a second step in the same process.

In FIG. 11, a film comprising a mixture of zinc oxide and silicon dioxide (a $ZnO\text{—}SiO_2$ film) has been deposited as a diffusion source 7, then covered with another aluminum nitride film forming an anneal cap 8. Annealing at a temperature of 700° C. for sixty minutes causes zinc to diffuse from the diffusion source 7 into the substrate 1, forming impurity diffusion regions 2 with a depth of substantially 1 $\mu$m below the diffusion windows.

Figure 12:
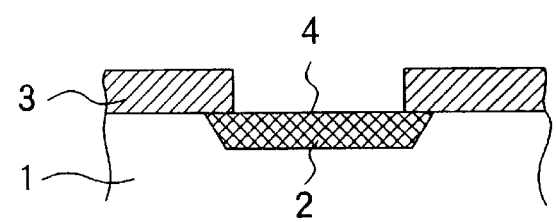
FIG. 12 illustrates a third step in the same process.

In FIG. 12, the diffusion source 7 and anneal cap 8 have been removed, first the anneal cap with hot phosphoric acid, then the diffusion source with buffered hydrofluoric acid. The $ZnO\text{—}SiO_2$ diffusion source 7 is not etched by hot phosphoric acid, and the AlN diffusion mask 3 is not etched by buffered hydrofluoric acid, so these removal steps can be executed as full-surface etches, leaving diffusion windows 4 of the proper size in the proper locations.

Figure 13:
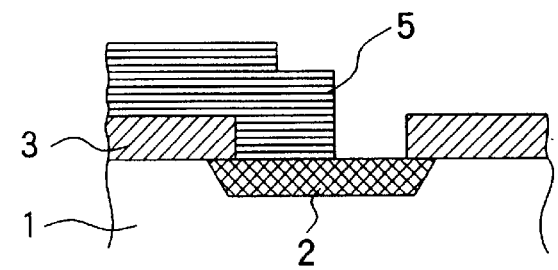
FIG. 13 illustrates a fourth step in the same process.

In FIG. 13, the p-electrodes 5 have been formed. A film of aluminum (Al) is evaporated as the p-electrode material onto the entire surface, then patterned by photolithography to form the electrodes 5. Further heat treatment is carried out a temperature in the range from 400° C. to 500° C. in an inert-gas atmosphere to sinter the p-electrodes 5 and obtain ohmic contacts between the electrodes and the diffusion regions.

The p-electrodes 5 can be patterned by use of a resist formed either before or after deposition of the electrode material. If the resist is formed before the electrode material, the resist is patterned to expose the regions where the p-electrodes will be formed. After the p-electrode material has been deposited, the resist is lifted off to remove the unwanted electrode material. If the resist is formed after the electrode material, the resist is patterned to cover the regions where the p-electrodes will be formed, and the rest of the p-electrode material is removed by etching.

Figure 14:
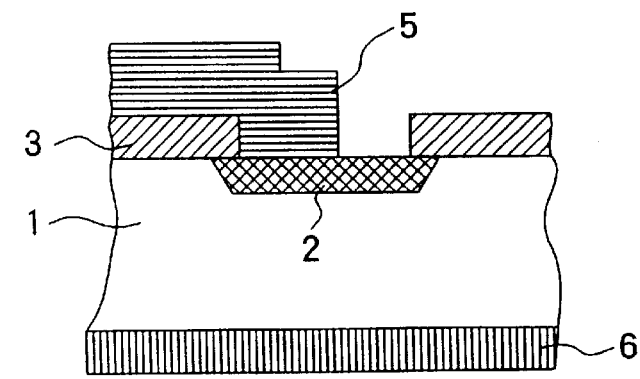
FIG. 14 illustrates a fifth step in the same process.

In FIG. 14, the underside of the substrate 1 has been polished, and a gold-alloy film has been deposited to form the n-electrode 6. Further heat treatment is carried out to sinter the n-electrode 6 and obtain an ohmic contact with the substrate 1.

This fabrication process enables a LED array to be formed with the diffusion depth, impurity concentration, and other properties needed for a 1200-DPI resolution. Use of aluminum-nitride films for the diffusion mask 3 and anneal cap 8 is advantageous in that aluminum nitride has a coefficient of thermal expansion similar to that of the n-type substrate 1. The anneal cap 1 and diffusion mask 3 accordingly subject the substrate 1 to very little mechanical stress during high-temperature annealing. As a result, lateral diffusion of the zinc impurity is kept within the normal limit of 1.5 times the diffusion depth Xj.

The invented LED array chip can also be fabricated by ion implantation, as will be described later.

A light-emitting diode array of arbitrary length can be constructed by placing LED array chips as described in the first embodiment end-to-end, in a linear arrangement, on a supporting surface such as a printed circuit board.

Second Embodiment

Figure 15:
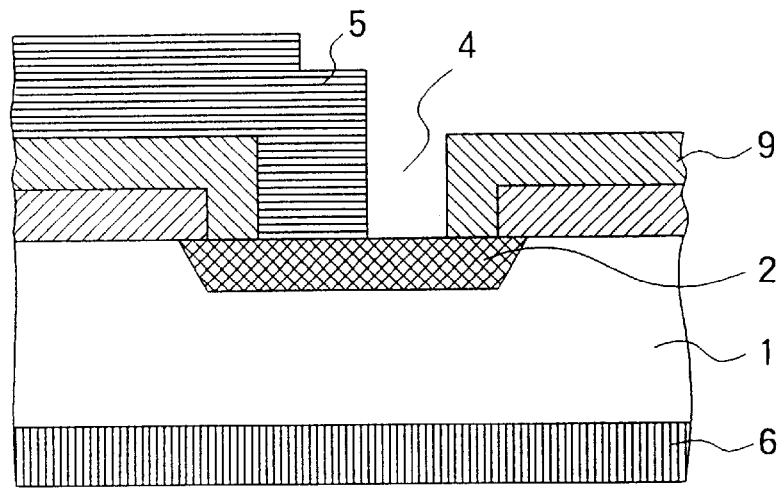
FIG. 15 is a sectional drawing illustrating a second embodiment of the invention.

Referring to FIG. 15, the second embodiment is also a 1200-DPI LED array formed by diffusing zinc into a $GaAs_{1-x}P_x$ substrate 1 by solid-phase diffusion, with a surface concentration of at least about $5\times10^{19}$ carriers per cubic centimeter and a diffusion depth of substantially 1 $\mu$m. The impurity diffusion regions 2, diffusion mask 3, p-electrodes 5, and n-electrode 6 are similar to the corresponding elements in the first embodiment. The second embodiment differs from the first embodiment in having an additional inter-layer isolation film 9 of silicon nitride (SiN), which is formed on the diffusion mask 3 after the solid-phase diffusion step, and patterned to leave the diffusion windows 4 open. The p-electrodes 5 are formed on this inter-layer isolation film 9, which thus provides an extra degree of electrical isolation between the substrate 1 and p-electrodes 5. The inter-layer isolation film 9 also helps assure electrical isolation between adjacent diodes.

Third Embodiment

Figure 16:
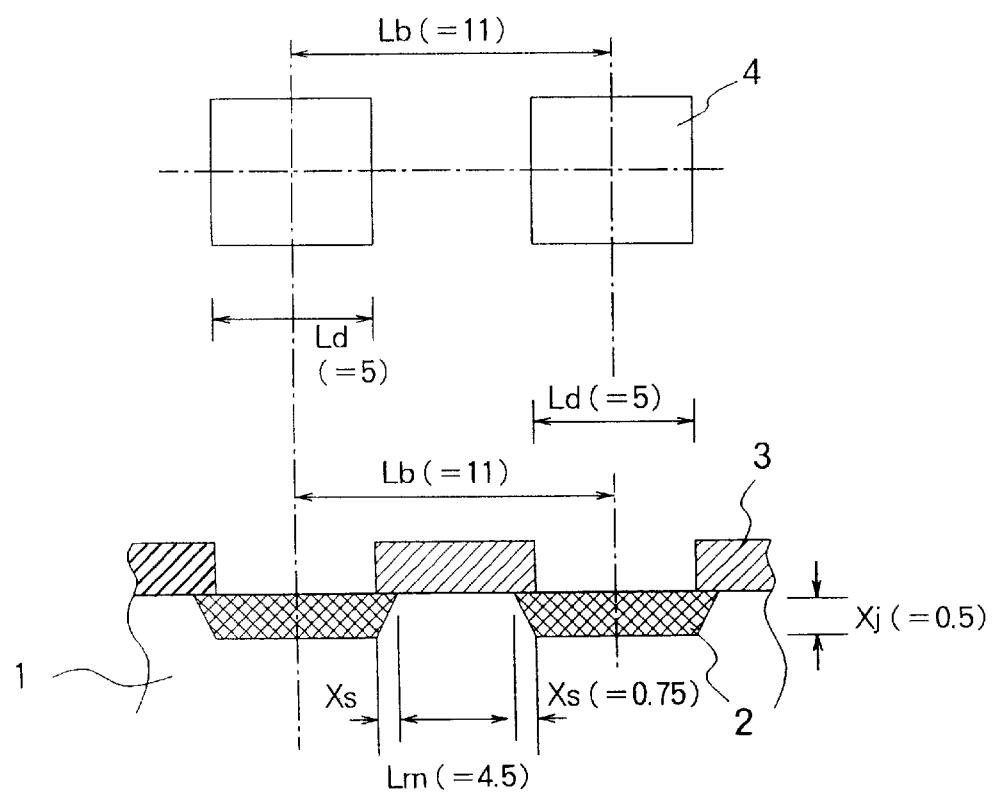
FIG. 16 illustrates a third embodiment of the invention.

FIG. 16 illustrates a 2400-DPI LED array in which the diffusion windows 4 have the same 5-$\mu$m width Ld as in the first embodiment, but are disposed at a pitch Lb of about 10.6 $\mu$m. The width of the space between diffusion windows 4 is accordingly 5.6 $\mu$m. The diffusion depth Xj is reduced to 0.5 $\mu$m, making the lateral diffusion distance Xs substantially equal to 0.75 $\mu$m. The diffusion margin Lm is accordingly 4.1 $\mu$m [calculated as 5.6 $\mu$m–(2×0.75 $\mu$m)]. This diffusion margin, although less than in the first embodiment, is still sufficient for feasible fabrication.

A 2400-DPI LED array can also be fabricated with a diffusion depth Xj of 1 $\mu$m, as in the first embodiment, if the width Ld of the diffusion windows 4 can be reduced to 3 $\mu$m. The diffusion margin Lm in this case is 4.6 $\mu$m [calculated as 10.6 $\mu$m–3 $\mu$m–(2×1.5 $\mu$m)], which is again adequate for feasible fabrication of the LED array chip.

According to experiments made by the inventors, the diffusion depth can be varied in the range from 0.5 $\mu$m to 2 $\mu$m with substantially no change in emitted light intensity. The present invention thus appears capable of providing LED arrays chips with resolutions up to at least 2400 DPI.

As noted earlier, the invented LED array chips can be fabricated by ion implantation instead of solid-phase diffusion. The ion implantation process for a 2400-DPI array will be described with reference to FIGS. 17 to 20.

Figure 17:
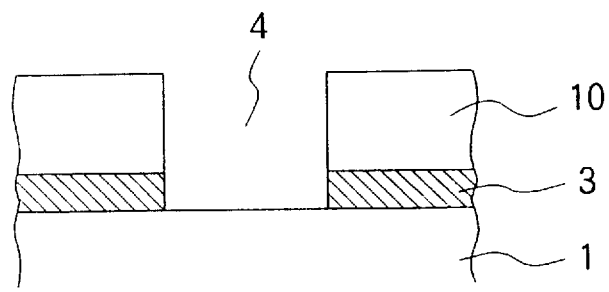
FIG. 17 illustrates a first step in an ion implantation process for fabricating any of the preceding embodiments.

In FIG. 17, an n-type $GaAs_{1-x}P_x$ substrate 1 has been coated with a diffusion mask 3 and resist 10, which have been patterned to form windows 4. The diffusion mask 3 is an aluminum-nitride film.

Figure 18:
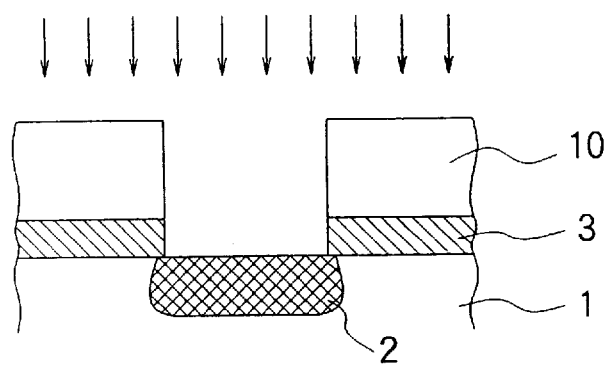
FIG. 18 illustrates a second step in this process.

In FIG. 18, zinc ions are accelerated by an ion implantation apparatus and implanted through the windows 4 into the substrate 1. The implantation conditions are an ion energy of 1 MeV, an ion beam diameter of 3 mm$\phi$, an ion current value of 0.2 $\mu$A, and an illumination time of 10 minutes. The resulting implantation depth is 0.5 $\mu$m. Though formed by ion implantation, the implanted regions will still be referred to as impurity diffusion regions 2.

Figure 19:
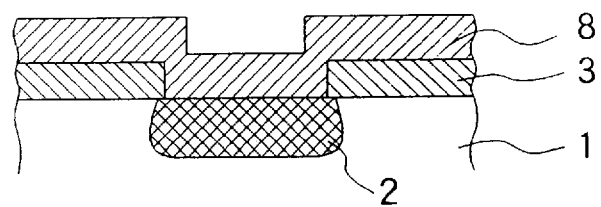
FIG. 19 illustrates a third step in this process.

In FIG. 19, the resist 10 has been removed, and an anneal cap 8 has been formed. Heat treatment at a temperature of 700° C. for thirty minutes drives the zinc ions into the substrate lattice, electrically activating the impurity diffusion regions 2. The diffusion depth, i.e. the depth of the pn junction, remains substantially 0.5 $\mu$m.

Figure 20:
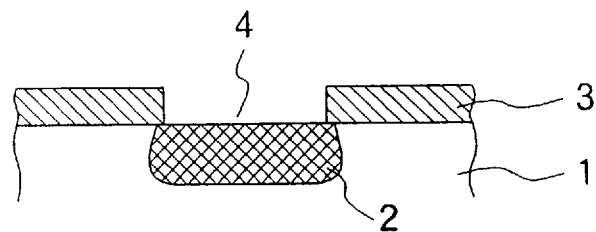
FIG. 20 illustrates a fourth step in this process.

In FIG. 20, the anneal cap film 8 has been removed to expose the impurity diffusion regions 2. The device is completed by forming p- and n-electrodes as described in the first embodiment.

Fourth Embodiment

The fourth embodiment is a LED array chip generally similar to the first or third embodiment, in which the shape of the diffusion windows 4 and impurity diffusion regions 2 has been modified.

Figure 21:
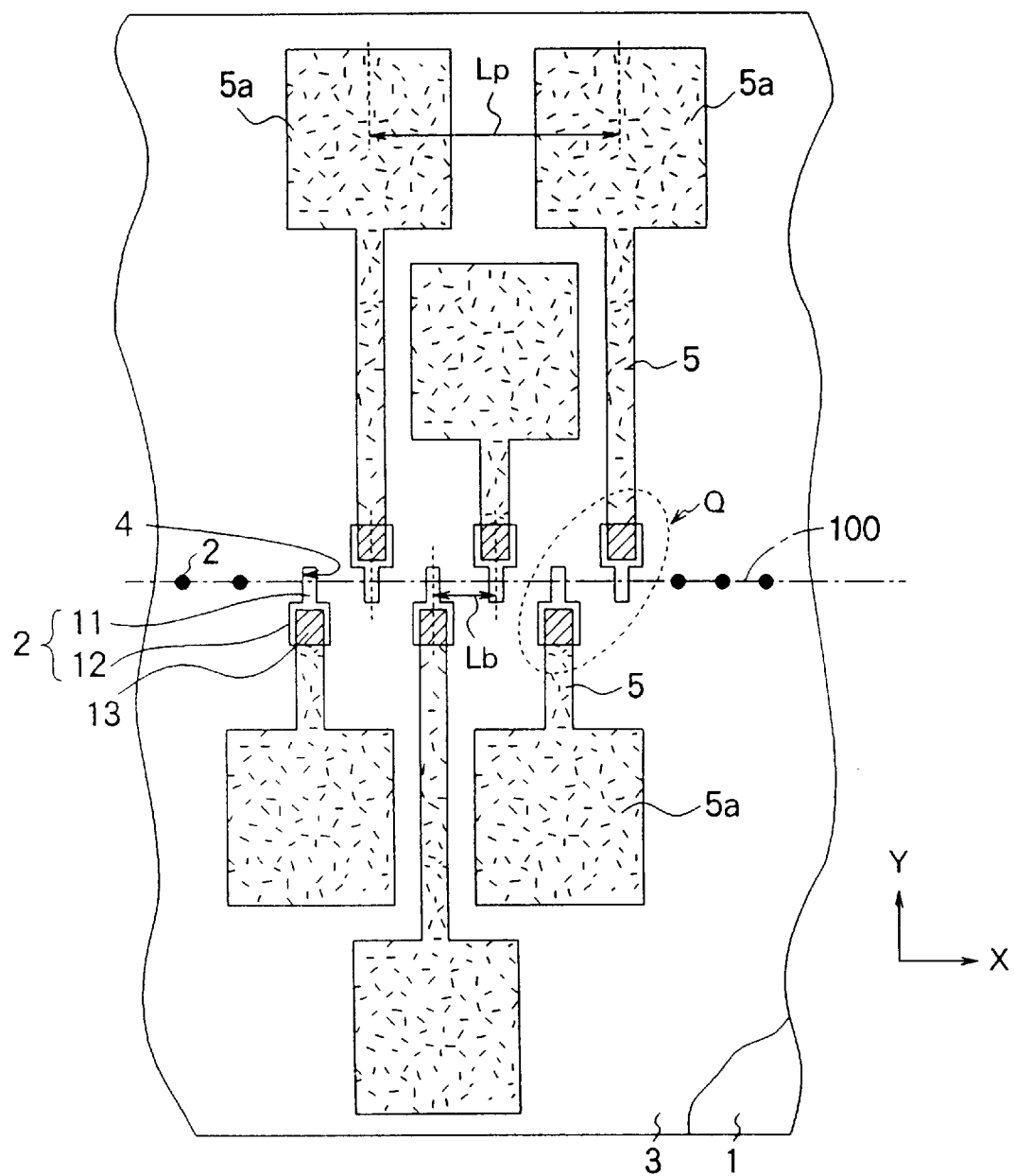
FIG. 21 is a plan view of a fourth embodiment of the invention.

Referring to the plan view in FIG. 21, the fourth embodiment has the same general layout as the previous embodiments, with p-electrodes 5 disposed on alternate sides of the array line 100 and the bonding pads 5a staggered so that the pad pitch Lp is four times the diode pitch Lb. The substrate 1 and diffusion mask 3 may comprise the same materials as in the preceding embodiments, but the shape of the diffusion windows 4 is altered so that each impurity diffusion region 2 comprises a comparatively narrow first region 11 and a comparatively wide second region 12. The first regions 11 function primarily as light-emitting regions. The second regions 12 are used primarily for electrical contact with the p-electrodes 5. The contact area 13 (hatched) occupies most or all of the area in the second regions 12.

For simplicity, lateral diffusion is ignored in this drawing and the impurity diffusion regions 2 are treated as having the same dimensions as the diffusion windows 4.

In this and subsequent drawings, the direction parallel to the array line 100 will be referred to as the X-direction, and the direction perpendicular to the array line 100 as the Y-direction, as indicated by the arrows marked X and Y.

Figure 22:
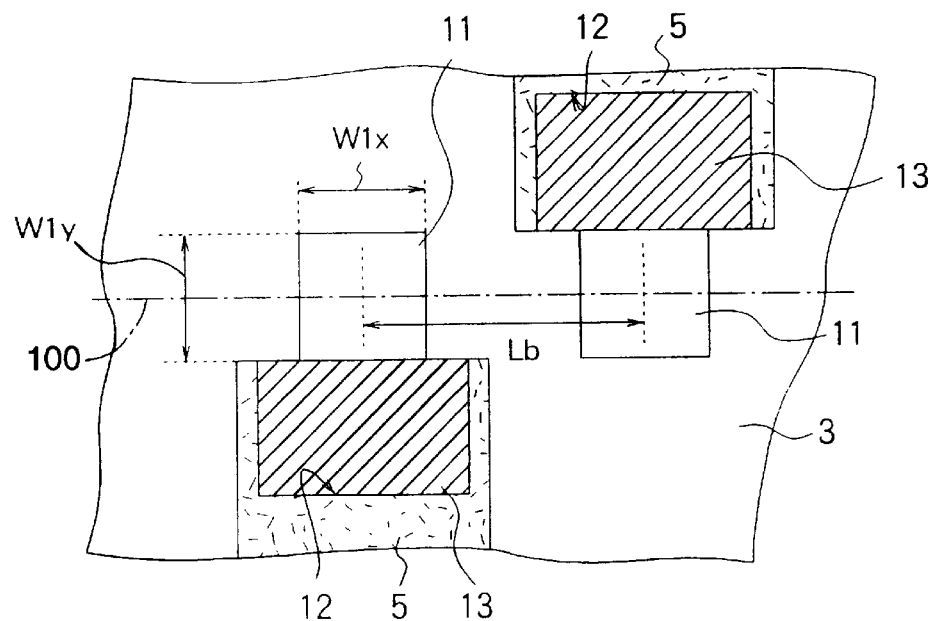
FIG. 22 is an enlarged plan view of two light-emitting diodes in the fourth embodiment.
Figure 23:
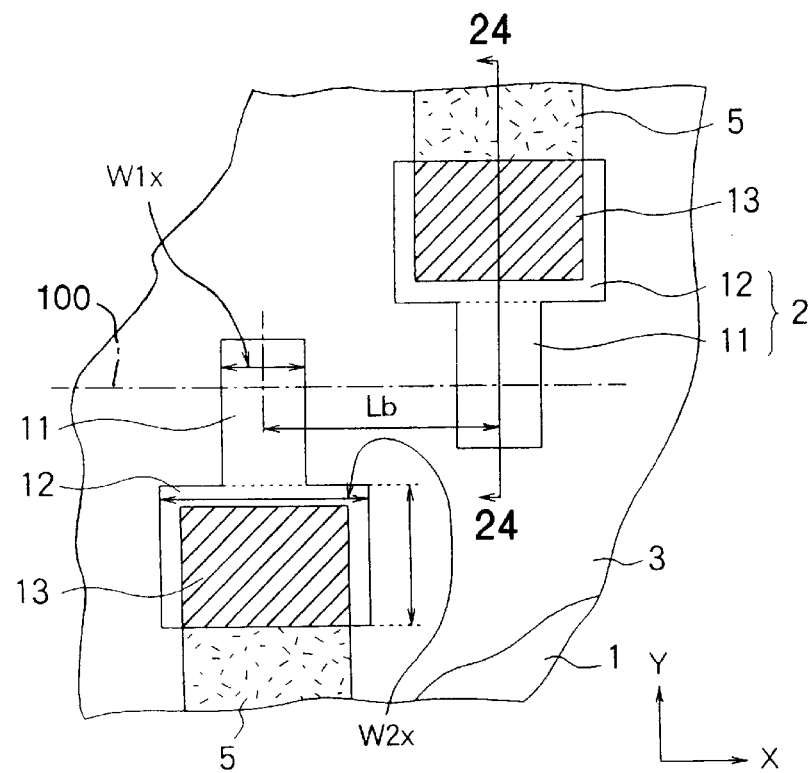
FIG. 23 is an enlarged plan view of two light-emitting diodes in a variation of the fourth embodiment.

FIGS. 22 and 23 are enlargements of region Q in FIG. 21, illustrating two possible configurations of the first and second regions 11 and 12. For good electrophotographic printing quality, the first regions 11 should have a shape that produces a substantially circular spot of emitted light. (The shape of the emitted light spot has a relatively large effect on printing quality.) This does not mean that the first regions 11 themselves need be circular; the first regions 11 can have various polygonal shapes. In the fourth embodiment, the first regions 11 are rectangular in shape, with dimensions W1x in the X-direction and W1y in the Y-direction, indicated in FIG. 22. The rectangular shape may be square (W1y/W1x= 1), as in FIG. 22, or non-square (W1y/W1x≠1), as in FIG. 23. The optimum length-to-width ratio (W1y/W1x) can be determined experimentally. The p-electrodes 5 may completely cover the second regions 12, as in FIG. 22, or only partly cover the second regions 12, as in FIG. 23.

Figure 24:
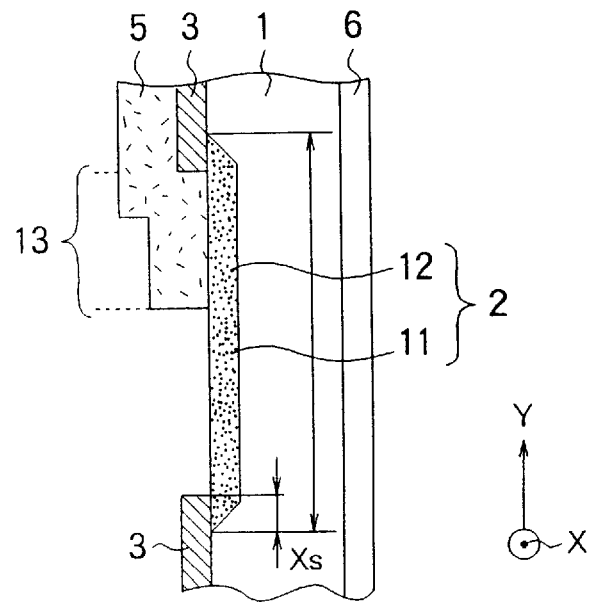
FIG. 24 is a sectional view of one light-emitting diode in FIG. 23.

FIG. 24 shows a sectional view through line 24—24 in FIG. 23, illustrating the lateral diffusion distance Xs.

The dimension W1x in FIGS. 22 and 23 is the width of the first regions 11, equal to the width of the diffusion windows defining those regions plus twice the lateral diffusion distance Xs. The maximum permissible value of W1x is given in terms of the diode pitch Lb and the required diffusion margin Lm by the following equation.

$$W1x=Lb-Lm$$

For a 1200-DPI array with a diffusion margin of 5 μm, W1x can be as large as 16.2 μm. If the diffusion depth is 1 μm, so that the lateral diffusion distance Xs is substantially 1.5 μm, the width of the diffusion windows defining the first regions 11 can be up to 13.2 μm. For a 2400-DPI array with the same diffusion depth and diffusion margin, W1x can be up to 5.6 μm and the parts of the diffusion windows 4 that define the first regions 11 can be up to 2.6 μm wide.

The dimension W2x in FIG. 23 is the width of the second regions 12, equal to the width of the diffusion windows defining those regions plus twice the lateral diffusion distance Xs. The second regions 12 are disposed alternately above and below the array line 100, so on each side of the array line 100, their pitch is twice the diode pitch Lb. This permits the width W2x of the second regions 12 to be greater than the width W1x of the first regions 11. In FIG. 23, W2x is twice as great as W1x, for example. The upper limit of W2x is given in terms of the diode pitch Lb and diffusion margin Lm by the following equation:

$$W2x=(2\cdot Lb)-Lm$$

If the necessary diffusion margin is 5 μm, then W2x can be up to 37.4 μm in a 1200-DPI array and up to 16.2 μm in a 2400-DPI array. Even in very high-resolution arrays, the second areas 12 can be wide enough to ensure an adequate contact area 13 with the p-electrodes 5. The second regions 12 can have a rectangular shape, as shown in the drawings, or can have any other suitable shape.

Figure 25:
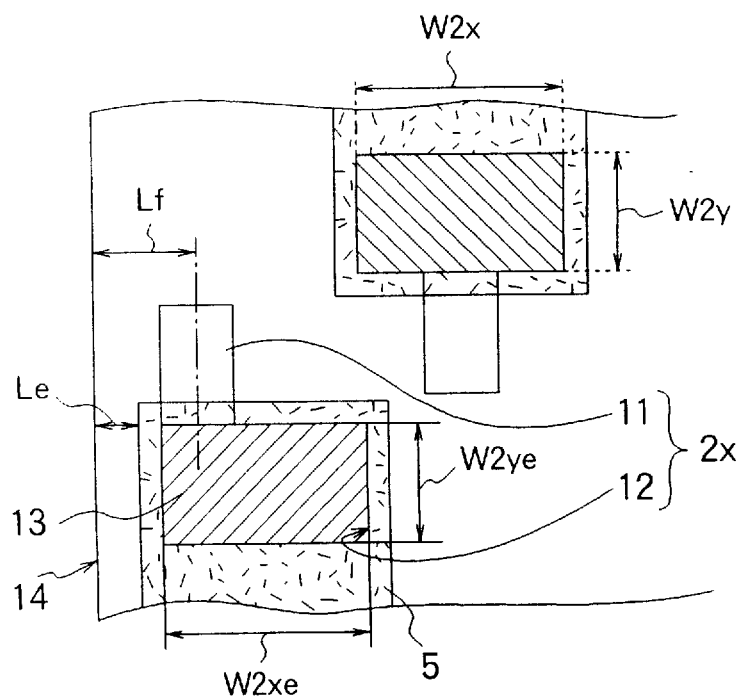
FIG. 25 is an enlarged plan view of two light-emitting diodes in another variation of the fourth embodiment.

Referring to FIG. 25, the impurity diffusion region 2x at each end 14 of the LED array chip preferably differs in configuration from the other impurity diffusion regions 2. Specifically, the sides of the first region 11 and second region 12 next to the end 14 of the chip in this impurity diffusion region 2x are aligned, so that the second region 12 does not extend farther toward the end 14 of the chip than does the first region 11. This can be accomplished without altering the diode pitch by shifting the second region 12 in impurity diffusion region 2x in toward the center of the array, as shown in the drawing, or by altering the dimensions W2xe and W2ye of the second region so that W2xe is reduced and W2ye is increased, in comparison with other impurity diffusion regions 2. The area W2xe×W2ye of the second region 12 in the impurity diffusion region 2x at the end of the chip can then be kept equal to the area W2x×W2y of the second regions 12 in other impurity diffusion regions 2, so that there is no reduction in the contact area 13 with the p-electrode 5.

One reason for this alteration of the shape of the impurity diffusion regions 2x at the ends of the LED array chip is to prevent these impurity diffusion regions 2x from extending right to the edge of the chip. A second reason is that the LED array chips in a LED array are sometimes placed so that they abut end-to-end, so to prevent short circuits between adjacent p-electrodes 5 on abutting chips in this case, and to prevent short circuits resulting from a p-electrode on one chip touching an n-type area on an adjacent chip, the p-electrodes must be disposed a certain distance Le from the ends of the chips. Accordingly, no purpose would be served by having the second region 12 extend closer than this distance Le to the end 14 of the chip.

To maintain an even spacing between diodes on different chips, the distance Lf from the center of the first region 11 to the end 14 of the chip, in the impurity diffusion region 2x at the end of the chip, should be substantially half the diode pitch Lb. The desired distance from the edge of impurity diffusion region 2x to the end 14 of the chip can be calculated from this distance Lf and the width W1x of the first regions 11.

Figure 26:
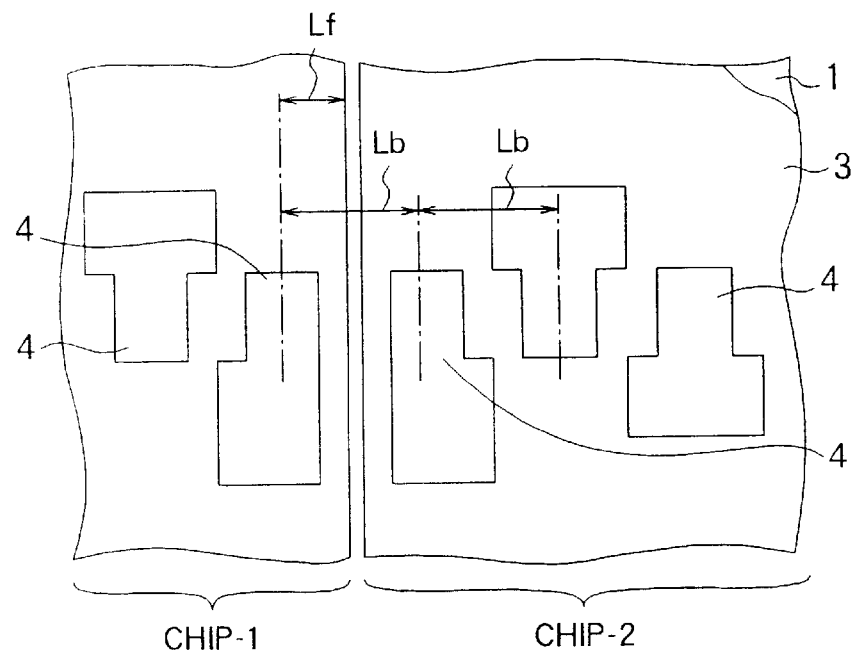
FIG. 26 illustrates two adjacent chips in a LED array.

FIG. 26 illustrates the relation of dimension Lf to the diode pitch Lb. Depending on the space allowed between adjacent LED array chips (denoted CHIP-1 and CHIP-2) in the array, Lf may be slightly less than one-half Lb.

Figure 27:
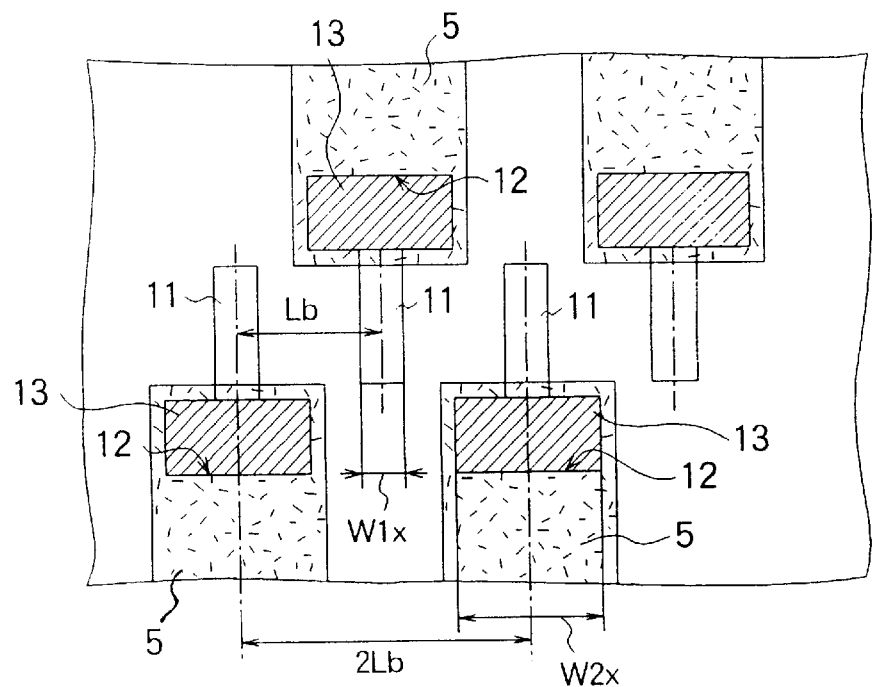
FIG. 27 is an enlarged plan view of four light-emitting diodes in yet another variation of the fourth embodiment.
Figure 28:
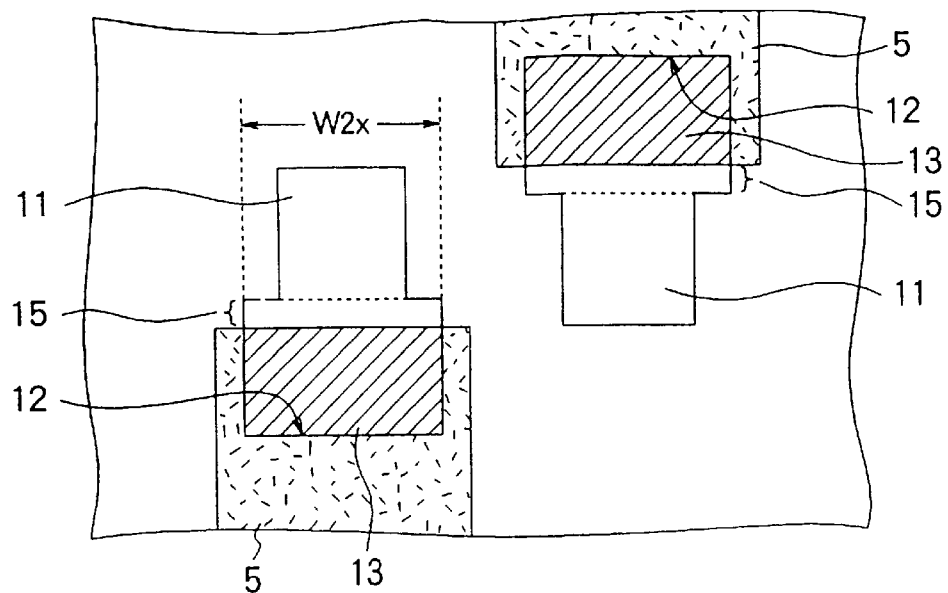
FIG. 28 is an enlarged plan view of two light-emitting diodes in still another variation of the fourth embodiment.

FIGS. 27 and 28 illustrate two more possible positional relationships among the p-electrodes 5 and the first and second regions 11 and 12 of the impurity diffusion regions 2.

In FIG. 27, the p-electrodes completely cover the second regions 12, and also cover the ends of the first regions 11 adjacent to the second regions 12. The first regions 11 moreover have a comparatively long and thin shape (dimension W1x is comparatively small). With this arrangement, slight positional variations among the p-electrodes 5 have relatively little effect on the emitting area of the first regions 11. Positional variations among the p-electrodes 5 also do not change the contact area 13 with the second regions 12, because the p-electrodes 5 are wider than the width W2x of the second regions 12, so the contact resistance between the p-electrodes 5 and impurity diffusion regions 2 does not differ significantly from diode to diode. With a uniform emitting area and uniform contact resistance, uniform emitted light intensity is easily achieved.

The first regions 11 in FIG. 27 are disposed in a slight zig-zag arrangement, so that after being partly covered by the p-electrodes 5, their light-emitting areas are evenly aligned.

As another example, FIG. 28 shows an arrangement in which the second regions 12 are larger than necessary for adequate electrical contact with the p-electrodes 5. This permits the edges of the second regions 12 adjacent to the first regions 11 to be left uncovered by the p-electrodes 5. This arrangement can be used to boost the emitted light intensity, by providing an extra emitting area 15 immediately adjacent to the p-electrodes 5, where the most intense emission is obtained.

Referring again to FIG. 7, although the emitted light intensity is substantially constant over the length of the emitting area, the intensity is not perfectly constant; there is a significant increase just in front of the p-electrode 5. With the arrangement in FIG. 28, this high-intensity emitting area 15 has the width W2x of the second regions 12, rather than the narrower width of the first regions 11, resulting in a significant gain in light emission.

In FIG. 28, as in FIG. 27, the first regions 11 are disposed in a slight zig-zag arrangement, so that the light-emitting areas will be aligned evenly.

Fifth Embodiment

Figure 29:
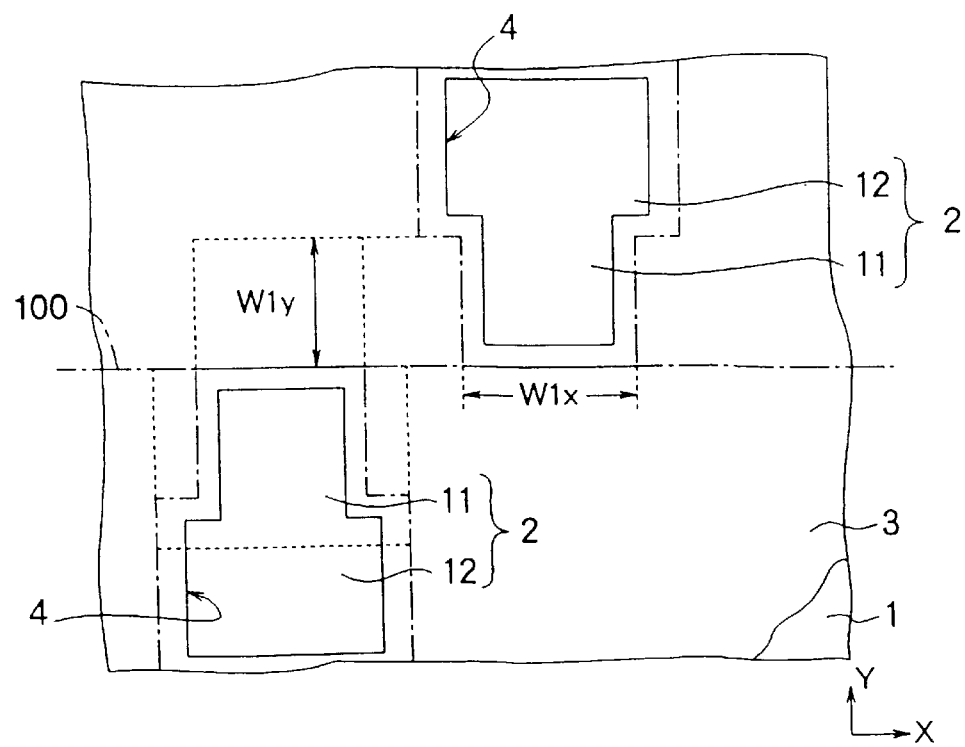
FIG. 29 is an enlarged plan view of two light-emitting diodes in a fifth embodiment.

Although the light-emitting first regions 11 were aligned in on the array line 100 in the fourth embodiment, this is not a necessary requirement. Referring to FIG. 29, the light-emitting first regions 11 can be disposed alternately above and below the array line 100. This arrangement can be used to obtain an extra design margin in very high-resolution arrays.

FIG. 29 indicates the diffusion windows 4 with solid lines, and indicates the outlines of the impurity diffusion regions 2 with dash-dot lines. The first regions 11 thus have the indicated dimensions W1x and W1y. With this arrangement, for a given diode pitch, W1x can be greater than in the previous embodiments. The diffusion windows 4 are disposed so that the edges of the first regions 11 are substantially aligned on the array line 100. This arrangement does not lead to an irregular appearance in electrophotographic printing, because the odd-numbered impurity diffusion regions 2 are aligned with one another in a straight row, and the even-numbered impurity diffusion regions 2 are also aligned with one another in a (different) straight row, both rows being parallel to the array line 100.

The variations in the positional relationships of the impurity diffusion regions 2 and p-electrodes 5 shown in FIGS. 22 to 28 are also applicable to this fifth embodiment.

The fourth and fifth embodiments can be fabricated by the process described in FIGS. 10 to 14, using solid-phase diffusion, or the process described in FIGS. 17 to 20, using ion implantation. The only difference is in the shape of the diffusion windows 4 that define the impurity diffusion regions 2.

In the fabrication process for any of the preceding embodiments, normally a large number of LED array chips are fabricated on a single semiconductor wafer, and the chips are separated from one another at the end of the fabrication process by dicing along lines marked during the fabrication process. The dicing line marks can be efficiently created by selective removal of part of the diffusion mask 3, thereby patterning the diffusion mask 3 with a linear grid of lines; thus the dicing line marks and diffusion windows 4 can be created in the same step.

Figure 30:
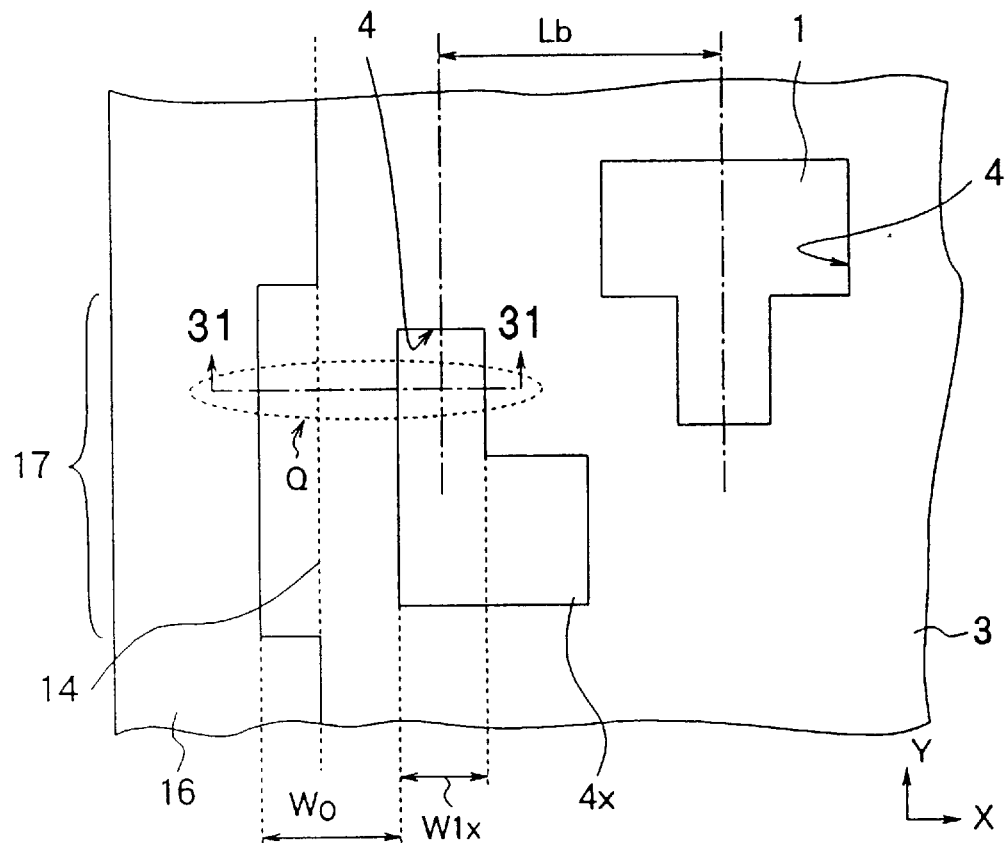
FIG. 30 illustrates a preferred configuration of the dicing line marks in any of the preceding embodiments.

Referring to FIG. 30, the dicing line marks 16 are preferably narrowed in regions 17 adjacent to the diffusion windows 4x at each end 14 of each LED array chip on the wafer. This applies only to the dicing line marks 16 running perpendicular to the array line of the LED array chip. The narrowed region 17 assures a certain minimum distance $W_0$ between the dicing line mark 16 and the diffusion window 4x. $W_0$ must exceed the diffusion margin, and must exceed the distance from the diffusion window 4x to the end of the chip 14, by an amount that takes lateral diffusion into account, so that during the fabrication process, the impurity diffusion regions at the ends of the LED array chips will not merge with impurity diffusion regions formed under the dicing line marks, and so that after the wafer has been diced, no unwanted impurity diffusion regions will remain adjacent to the diode impurity diffusion regions at the ends of the LED array chips. If necessary, the dicing line mark can be completely eliminated in the areas 17 adjacent to the diffusion windows 4x at the ends of the LED array chips, provided this does not impede dicing.

Figure 31:
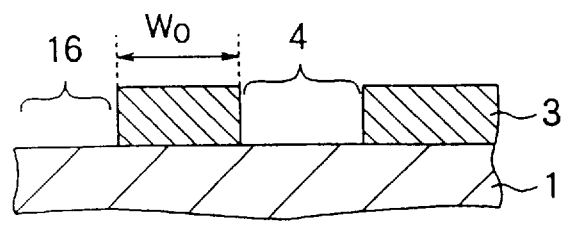
FIG. 31 is a sectional view through line I—I in FIG. 30.

FIG. 31 illustrates the dimension $W_0$ in a sectional view through line 31—31 in FIG. 30. $W_0$ is the minimum separation between the dicing line marks 16 and diffusion windows 4.

When the solid-phase diffusion process or ion implantation process is carried out, zinc impurity will pass through the dicing line marks 16 as well as through the diffusion windows 4, forming impurity diffusion regions below the dicing lines. When the wafer is diced, however, if the dimension $W_0$ has been selected as described above, in the locations adjacent to the diodes at the ends of the LED array chips, the impurity diffusion regions below the dicing lines will be completely removed; no unwanted impurity diffusion regions will remain there to impair the performance of the LED array chips.

A further benefit of the narrowed regions 17 in FIG. 30 is that the extra amount of diffusion mask 3 left in the vicinity of the diffusion windows 4x at the ends of the chips makes the mechanical stress conditions around the diffusion windows 4x at the ends of the LED array chip similar to the mechanical stress conditions around other diffusion windows 4, leading to a more uniform array.

Figure 32:
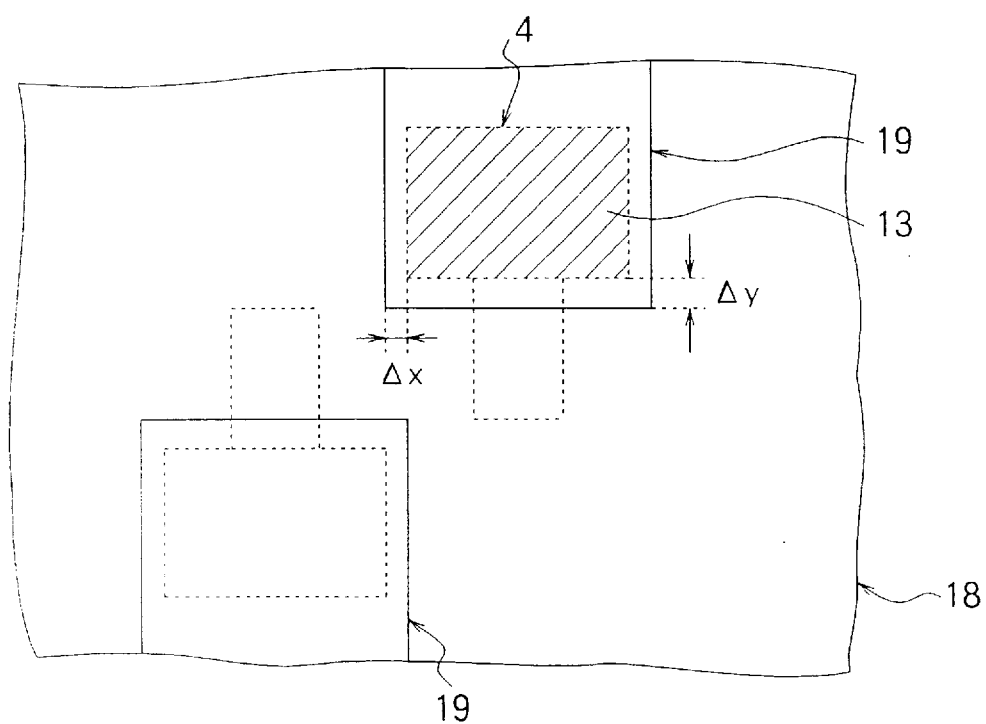
FIG. 32 illustrates dimensional allowances in another variation of the fourth embodiment.

FIG. 27 illustrated an arrangement in which the p-electrodes 5 completely covered the second regions 12 of the impurity diffusion regions 2. As described earlier, the p-electrodes 5 are formed by patterning a resist. Referring to FIG. 32, a photomask 18 is employed for this patterning process. For the arrangement in FIG. 27, the patterns 19 in the photomask 18 that define the p-electrode areas are enlarged by amounts Δx and Δy with respect to the size of the diffusion windows 4 in the contact areas 13 between the p-electrodes 5 and impurity diffusion regions. These amounts Δx and Δy can be determined according to the alignment performance of the stepper apparatus used to expose the resist through the photomask 18, and to the required performance specifications of the LED array. The dimensions Δx and Δy should be determined so that within the anticipated range of misalignment between the photomask 18 and the windows 4 in the diffusion mask 3, the necessary contact area 13 between the p-electrodes 5 and impurity diffusion regions 2 will be assured despite the misalignment. The LED array chips will then meet their specification even if some of the p-electrodes 5 fail to align with the second regions 12 exactly as intended.

A similar enlargement of the p-electrode photomask pattern can be used to assure satisfactory electrical contact in the other variations shown in FIGS. 21 to 25, and in the first three embodiments.

As noted above, the invention can also be applied to a light-sensing diode array chip, or a light-sensing-and-emitting diode array chip. Effects similar to those described in the embodiments above will be obtained.

The invention is not limited to resolutions of 1200 DPI and 2400 DPI. The invention can be usefully applied in any light-sensing/emitting diode array with a resolution equal to or greater than 1200 DPI. The patterns illustrated in FIGS. 3 and 21, for example, can be adapted to a variety of resolutions by altering the size of the electrode pads 5a, without changing the size of the light-emitting areas or electrode contact areas, hence without altering the luminous output of the diodes. For the same reason, the array density can be raised without making the fabrication process more sensitive to misalignment between the electrode photomask and the diffusion mask.

The invention is not limited to the use of a gallium-arsenide-phosphide epitaxial layer grown on a gallium-arsenide base substrate. Other compound semiconductor materials, such as gallium-aluminum-arsenide (GaAlAs) can be employed instead of GaAsP.

The invention is not limited to diffusion depths in the range from 0.5 $\mu$m to 1 $\mu$m. The diffusion depth can be as great as 2 $\mu$m. At 1200 DPI, with 5-$\mu$m diffusion windows, a 2-$\mu$m diffusion depth allows a 10-$\mu$m diffusion margin. Even if lateral diffusion proceeds to twice the expected limit, that is, to three times the diffusion depth instead of 1.5 times, the diffusion margin is still 4 $\mu$m, which is sufficient to isolate adjacent diodes from one another.

Those skilled in the art will recognize that further modifications are possible within the scope of the invention as claimed below.

What is claimed is:

1. A light-sensing/emitting diode array chip having a plurality of diodes created by selectively doping a semiconductor substrate of one conductive type with an impurity of another conductive type, thus forming impurity diffusion regions, wherein:

said diodes are disposed at a pitch of at least one thousand two hundred diodes per inch;

said impurity diffusion regions have a depth of at least 0.5 $\mu$m but not more than 2 $\mu$m in said semiconductor substrate; and said impurity has a surface concentration of at least $5 \times 10^{19}$ carriers per cubic centimeter.

2. The chip of claim 1, wherein said impurity comprises zinc, and said semiconductor substrate comprises gallium-arsenide-phosphide.

3. The chip of claim 1, wherein said impurity comprises zinc, and said semiconductor substrate comprises gallium-aluminum-arsenide.

4. The chip of claim 1, wherein said impurity diffusion regions are formed by solid-phase diffusion.

5. The chip of claim 1, wherein said impurity diffusion regions are formed by ion implantation.

6. The chip of claim 1, wherein said one conductive type is n-type and said another conductive type is p-type.

7. The chip of claim 1, further comprising a plurality of electrodes for supplying current to respective impurity diffusion regions, wherein:

each of said impurity diffusion regions comprises a first region which does not make contact with any of said electrodes, and a second region which is contiguous with said first region, makes contact with a corresponding electrode among said electrodes, and provides an area of contact with said corresponding electrode adequate to assure that a certain contact resistance is not exceeded;

said impurity diffusion regions are arrayed along an array line, said second region being farther than said first region from said array line;

said impurity diffusion regions are numbered in order along said array line;

odd-numbered impurity diffusion regions have their second region on one side of said array line;

even-numbered impurity diffusion regions have their second region on another side of said array line; and said electrodes do not extend into any area disposed between the first region of one of said diodes and the first region of another one of said diodes.

8. The chip of claim 7, wherein said second region is wider than said first region, as measured in a direction parallel to said array line.

9. The chip of claim 8, wherein if an impurity diffusion region among said impurity diffusion regions is disposed adjacent to an end of said light-sensing/emitting diode array chip, the second region of this impurity diffusion region does not extend closer to said end of said light-sensing/emitting diode array chip than does the first region of this impurity diffusion region.

10. The chip of claim 8, wherein said corresponding electrode covers a first part of said second region adequate to assure that said certain contact resistance is not exceeded, and exposes a second part of said second region, said second part being contiguous with said first region.

11. The chip of claim 7, wherein said first region has a shape that emits an essentially circular spot of light.

12. The chip of claim 11, wherein said first region has a rectangular shape.

13. The chip of claim 7, wherein said corresponding electrode covers said second region.

14. The chip of claim 7, wherein:

said electrodes have pads used for connection to an external device;

the pads of the electrodes making contact with said odd-numbered impurity diffusion regions are arrayed in a staggered pattern on said one side of said array line; and the pads of the electrodes making contact with said even-numbered impurity diffusion regions are arrayed in a staggered pattern on another side of said array line.

15. The chip of claim 7, wherein said impurity diffusion regions are disposed so that their first regions are aligned on said array line.

16. The chip of claim 7, wherein said odd-numbered impurity diffusion regions have their first regions disposed on said one side of said array line, and said even-numbered impurity diffusion regions have their first regions disposed on another side of said array line.

17. The chip of claim 7, wherein all first regions of all of said light-emitting diodes are evenly aligned with one another.

18. The chip of claim 7, wherein said odd-numbered impurity diffusion regions have their first regions evenly aligned, and said even-numbered impurity diffusion regions have their first regions aligned at an offset from the first regions of said odd-numbered impurity diffusion regions, so that the first regions of the light-emitting diodes are aligned in a zig-zag manner.

19. A light-sensing/emitting diode array comprising a plurality of light-sensing/emitting diode array chips as described in claim 1, disposed in a straight line.

20. The chip of claim 1, wherein the surface concentration of said impurity, when multiplied by the depth of said impurity diffusion regions, is at least $5 \times 10^{15}$ carriers per square centimeter, but not more than $2 \times 10^{16}$ carriers per square centimeter.

21. The chip of claim 1, wherein said impurity has a surface concentration of less than $5 \times 10^{20}$ carriers per cubic centimeter.

22. A diode array chip, comprising:

a semiconductor substrate having a first conductivity type at least one insulating layer on the substrate, the at least one insulting layer having windows in it, each window having a first portion that is disposed along an array line and a second portion that is spaced apart from the array line, the first portions of the windows being disposed at a spacing Lb which provides a pitch of at least 1200 first portions per inch, the spacing Lb being measured in a direction parallel to the array line, the first portions of the windows having a width Ld measured in the direction parallel to the array line;

impurity diffusion regions in the substrate beneath the windows, the impurity diffusion regions having an impurity of a second conductivity type with a surface concentration of at least $5 \times 10^{19}$ impurity carriers per cubic centimeter, the impurity diffusion regions having a depth of at least about 0.5 $\mu$m but not more than about 2 $\mu$m, the impurity diffusion regions having first portions under the first portions of the windows and second portions under the second portions of the windows, the first portions of the impurity diffusion regions being spaced apart from the first portions of adjacent impurity regions by a distance Lm, measured at the surface of the substrate in the direction parallel to the array line;

bonding pads on the at least one insulating layer; and electrodes which extend from the bonding pads to the windows and which make electrical contact with the second portions of the impurity diffusion regions via the second portions of the windows and which leave the first portions of the windows unobstructed for passage of light, wherein Lm is at least as large as Ld.

23. The chip of claim 22, wherein Lm is at least twice as large as Ld.

24. The chip of claim 22, wherein Lb is less than twice as large as Lm.

25. The chip of claim 22, wherein Ld is about 5 $\mu$m.

26. The chip of claim 22, wherein the electrodes have a width, measured in the direction of the direction parallel to the array line, that is greater than Ld.

27. The chip of claim 22, wherein the second portions of the windows have a width, measured in the direction parallel to the array line, that is larger than Ld.

28. The chip of claim 27, wherein the electrodes have a width, measured in the direction parallel to the array line, that is larger than the width of the second portions of the windows.

29. The chip of claim 22, wherein each window has a pair of outer ends, one of the outer ends being further from the array line than the other, and wherein the outer ends that are furthest from the array line form a staggered pattern.

* * * * *